United States Patent
Shaw et al.

(10) Patent No.: US 10,192,979 B2
(45) Date of Patent: Jan. 29, 2019

(54) VACUUM TRANSISTOR STRUCTURE USING GRAPHENE EDGE FIELD EMITTER AND SCREEN ELECTRODE

(71) Applicant: The United States of America, as represented by the Secretary of the Navy, Washington, DC (US)

(72) Inventors: Jonathan L. Shaw, Springfield, VA (US); John Bradley Boos, Springfield, VA (US); Kevin Jensen, Kensington, MD (US); James G. Champlain, Alexandria, VA (US); Bradford B. Pate, Arlington, VA (US); Byoung-don Kong, Fairfax, VA (US); Doewon Park, Herndon, VA (US); Joan E. Yater, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 113 days.

(21) Appl. No.: 15/206,513

(22) Filed: Jul. 11, 2016

(65) Prior Publication Data
US 2017/0012103 A1  Jan. 12, 2017

Related U.S. Application Data

(60) Provisional application No. 62/190,405, filed on Jul. 9, 2015.

(51) Int. Cl.
| | | |
|---|---|---|
| H01L 29/76 | (2006.01) | |
| H01L 29/40 | (2006.01) | |
| H01L 29/10 | (2006.01) | |
| H01L 29/16 | (2006.01) | |
| H01L 29/66 | (2006.01) | |

(52) U.S. Cl.
CPC ...... *H01L 29/7606* (2013.01); *H01L 29/1033* (2013.01); *H01L 29/1606* (2013.01); *H01L 29/404* (2013.01); *H01L 29/66045* (2013.01)

(58) Field of Classification Search
CPC combination set(s) only.
See application file for complete search history.

(56) References Cited

U.S. PATENT DOCUMENTS

| | | | |
|---|---|---|---|
| 5,214,347 A | 5/1993 | Gray | |
| 2005/0176179 A1* | 8/2005 | Ikushima | H01L 37/00 438/125 |
| 2006/0231858 A1* | 10/2006 | Akimoto | H01L 27/124 257/140 |

(Continued)

*Primary Examiner* — Ratisha Mehta
(74) *Attorney, Agent, or Firm* — US Naval Research Laboratory; Joseph T. Grunkemeyer

(57) ABSTRACT

A device having: a substrate having a dielectric surface; a gate electrode; a drain electrode; a source electrode having a conductive contact and a two-dimensional material edge; and a dielectric material between the source and the gate. The source is adjacent to the gate. The drain electrode is not laterally between the edge and the gate electrode, and the distance from the drain electrode to the edge is greater than the distance from the gate electrode to the edge. The edge does not contact any other component of the device. The gate, drain, and source are not in electrical contact with each other. There is a line of sight or electron path from the edge to the drain electrode.

36 Claims, 7 Drawing Sheets

(56) References Cited

U.S. PATENT DOCUMENTS

| | | | | |
|---|---|---|---|---|
| 2012/0248414 A1* | 10/2012 | Kim | ................ | B82Y 10/00 257/29 |
| 2013/0264621 A1* | 10/2013 | Nishi | ................ | H01L 27/10826 257/296 |
| 2015/0214304 A1* | 7/2015 | Park | ................ | H01L 29/1606 257/29 |
| 2016/0359062 A1* | 12/2016 | Heo | ................ | H01L 31/0352 |

\* cited by examiner

VACUUM TRANSISTOR STRUCTURE USING GRAPHENE EDGE FIELD EMITTER AND SCREEN ELECTRODE

This application claims the benefit of U.S. Provisional Application No. 62/190,405, filed on Jul. 9, 2015. The provisional application and all other publications and patent documents referred to throughout this nonprovisional application are incorporated herein by reference.

TECHNICAL FIELD

The present disclosure is generally related to vacuum field effect transistors.

DESCRIPTION OF RELATED ART

The high frequency performance of semiconductor field effect transistor devices is limited by the electron velocity in the semiconductor material, which in turn limits the source-drain distance and the gate length. As the distance between source and drain is reduced (to allow higher frequency performance), the maximum source-drain voltage is reduced and the gate-drain capacitance is increased. These changes limit the power output, gain, and efficiency of the device.

The electron velocity in a vacuum is much higher than in solids, allowing longer path lengths and/or shorter transit times. At kinetic energies of several hundred eV, the electron velocity in vacuum is near $10^9$ cm/s, whereas the electron velocity in semiconductors typically saturates near $10^7$ cm/s. The larger dimensions allow the gate-source capacitance to be reduced and the source-drain distance to be increased. However, the dimensions of a vacuum device designed to operate at state-of-the-art frequencies (e.g. near or above 100 GHz) require the source-drain distance to be several microns, much too small to be fabricated with conventional macroscopic techniques. Thus micro-fabrication methods similar to those used to create solid state devices are required. In order to use these fabrication methods, a compatible source of vacuum electrons must be incorporated.

Vacuum electron sources rely on thermal energy (thermionic emission), optical energy (photoemission), quantum mechanical tunneling (field emission), or combinations of the three. Of these, field emission devices are most easily fabricated using planar lithographic methods.

Field emission requires that a large electric field exist near the emitter surface. To create the electric field, a voltage is applied between the field emitter and a second electrode (both made from conductive materials), separated by an insulating material. A sharp tip or edge feature is typically created at the emitter site to concentrate the charge density and electric field at the apex of the sharp feature. This geometric field enhancement reduces the required electric field in the insulating material. The geometric field enhancement is larger for thinner edges, hence use of a 2D material creates high field enhancement. However, the field in the insulator is typically still larger than many insulators can sustain reliably, such that only select dielectric materials able to withstand the high electric field can be used.

For many high frequency applications it is desirable to change the emitted current as rapidly as possible while also dissipating as little energy as possible. For this reason, the conductive materials should ideally have the highest electrical conductivity possible and the dielectric constant of the insulating material should be as low as possible.

BRIEF SUMMARY

Disclosed herein is a device comprising: a substrate having a dielectric surface; a gate electrode on the substrate; a drain electrode on the substrate; and a source electrode comprising a conductive contact and an edge comprising a two-dimensional material. The source electrode is adjacent to the gate electrode. The drain electrode is not laterally between the edge and the gate electrode, and the distance from the drain electrode to the edge is greater than the distance from the gate electrode to the edge. The edge does not contact any other component of the device. The gate electrode, the drain electrode, and the source electrode are not in electrical contact with each other. The device is configured to provide a line of sight or electron path from the edge to the drain electrode.

Also disclosed herein is a method of fabricating a device comprising: providing a substrate having a dielectric surface; depositing a gate electrode material, a dielectric material, and a source electrode material onto the substrate to form a stack; etching away a portion of the stack to form a gate electrode and a source electrode; and depositing a drain electrode material onto the substrate to form a drain electrode. The dielectric material is between the source electrode material and the gate electrode material. The source electrode comprises: a conductive contact and an edge comprising a two-dimensional material. The source electrode is on the substrate or the gate electrode. The drain electrode is not laterally between the edge and the gate electrode, and the distance from the drain electrode to the edge is greater than the distance from the gate electrode to the edge. The edge does not contact any other component of the device. The edge is laterally between the gate electrode and the drain electrode. The gate electrode, the drain electrode, and the source electrode are not in electrical contact with each other. The device is configured to provide a line of sight or electron path from the edge to the drain electrode.

Also disclosed herein is a method of fabricating a device comprising: providing a substrate having an optically flat and smooth dielectric surface; patterning a conducting layer to form a source electrode contact, a gate electrode, optionally a field plate electrode, and a drain electrode; depositing one or more layers of sacrificial materials; depositing a conductive two-dimensional material over the sacrificial layers; depositing a protective layer over the two-dimensional material; depositing a metal onto selected areas of the two-dimensional material by: patterning a photoresist; removing the protective layer; depositing the metal; removing unwanted portions of the two-dimensional material; removing any remaining photoresist; removing the exposed sacrificial material not covered by the metal or the two-dimensional material by exposure to a vapor-phase etch; wherein removing the exposed sacrificial layer undercuts the two-dimensional material at least 100 nm from the edge. The gate is laterally between the source edge and the drain electrode. The gate electrode, the drain electrode, and the source electrode are not in electrical contact with each other. The device is configured to provide a line of sight from the edge to the drain electrode.

BRIEF DESCRIPTION OF THE DRAWINGS

A more complete appreciation will be readily obtained by reference to the following Description of the Example Embodiments and the accompanying drawings.

DETAILED DESCRIPTION OF EXAMPLE EMBODIMENTS

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

Disclosed is a transistor having a short transit time near 1 picosecond (ps), which is suitable for operation at and above 100 GHz, as well as a maximum source-drain voltage over 1000 V, and a combination of: low gate resistance; low gate-source capacitance; and very high source-drain output resistance such that the intrinsic unity power gain frequency becomes high at moderate transconductance ($g_m$) (calculated 1 THz at $g_{m=}20$ mS/mm). Potential applications include spectroscopy, imaging, and range-finding.

Figure 1:
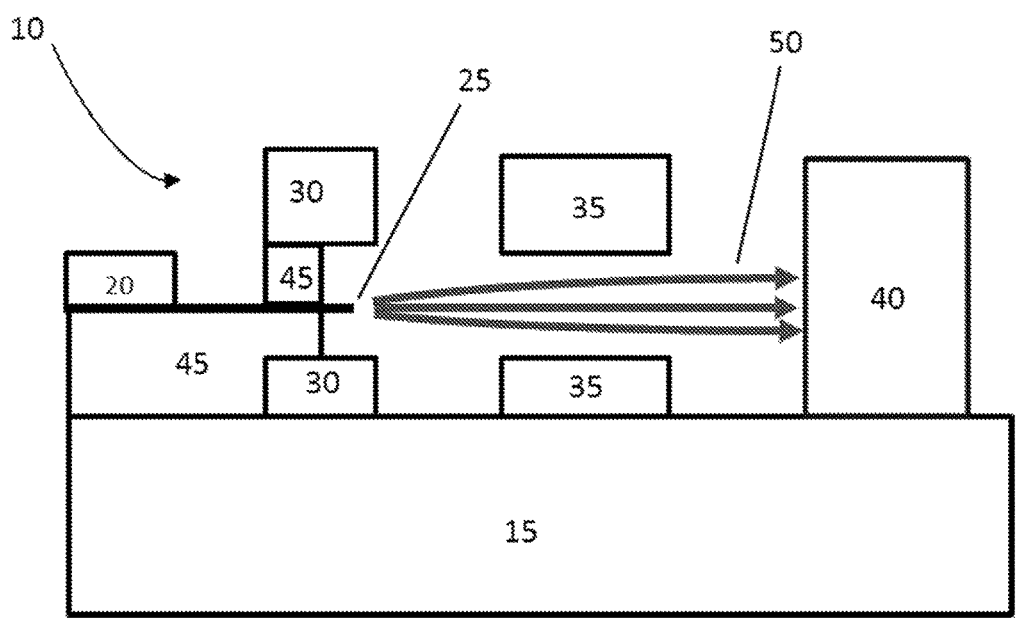
FIG. 1 shows a scale drawing of a cross section of one possible structure cross section.

The structure may utilize a graphene edge field emission source, diamond gate dielectric, and a field plate (or screen) electrode used to isolate the source and gate from the drain. FIG. 1 shows a scale drawing of a cross section of one possible structure 10 cross section, including the substrate 15, conductive contact 20, emitter edge 25, gate eletrode 30, field plate 35, drain electrode 40, dielectric material 45, and electron trajectories 50. The structure may extend into the third dimension an arbitrary distance. The distance may be limited by changes in the input power and phase, which accumulate with distance.

A field emission source made of graphene may be used to provide vacuum electrons. The vacuum electrons acquire high velocities and thus allow shorter transit times than solid state devices.

The device geometry utilizes a lateral edge field emitter, similar to U.S. Pat. No. 5,214,347 "Layered thin-edged field-emitter device". The present design differs from that patent in specifying a two-dimensional material, such as graphene as the field emitter. The present geometry may also include a fourth electrode (the field plate) used to reduce (screen) the electric fields between the gate and drain, and between the source and drain.

Graphene has many advantages as a field emission source, as described below. Any edge emitter has the disadvantage that it is more difficult to develop a high electric field (done by concentrating the field from a large area into a small area) at an edge rather than a point/tip (supported by a cone or cylinder). The present design overcomes this issue by using the edge of a 2D material (graphene).

Figure 2:
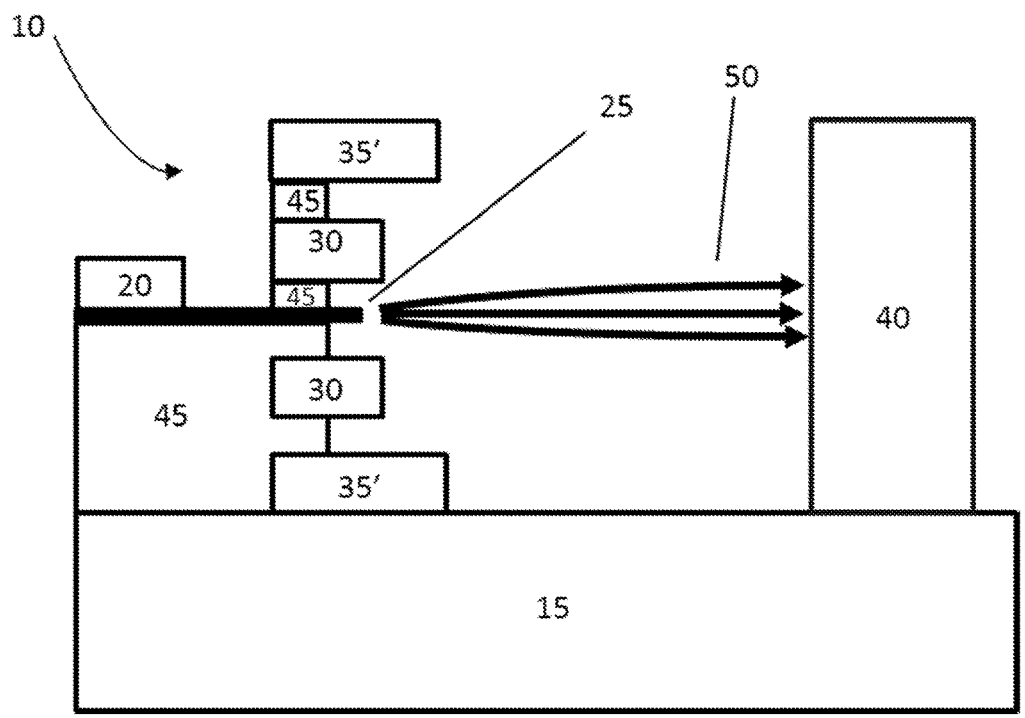
FIG. 2 shows an alternative geometry, where the screen electrode is placed above and below the gate electrode.

FIG. 2 shows an alternative geometry, where the field plate electrode 35' is placed above and below the gate electrode 30, rather than in front of it. In this case, the source-drain distance can be made much smaller, therefore enabling higher frequency performance. The structure has the additional advantage that the lateral extent of the field plate electrode can be substantially reduced, such that the transit time can also be reduced. Transit times well below 1 ps can be achieved in this way; however the capacitance between the gate and field plate may increase.

It may be more difficult to fabricate this structure since it may be necessary to etch through additional layers of material to create the large undercut shown. To be most effective, the field plate should extend in front of the gate electrode as shown. In fact, the isolation can be more complete in the alternative geometry as shown in FIG. 2 than in the geometry shown in FIG. 1. The electrode screening function is still substantially effective if the undercut is reduced, up to a point where the faces of the gate and screen are roughly co-planar.

Figure 3:
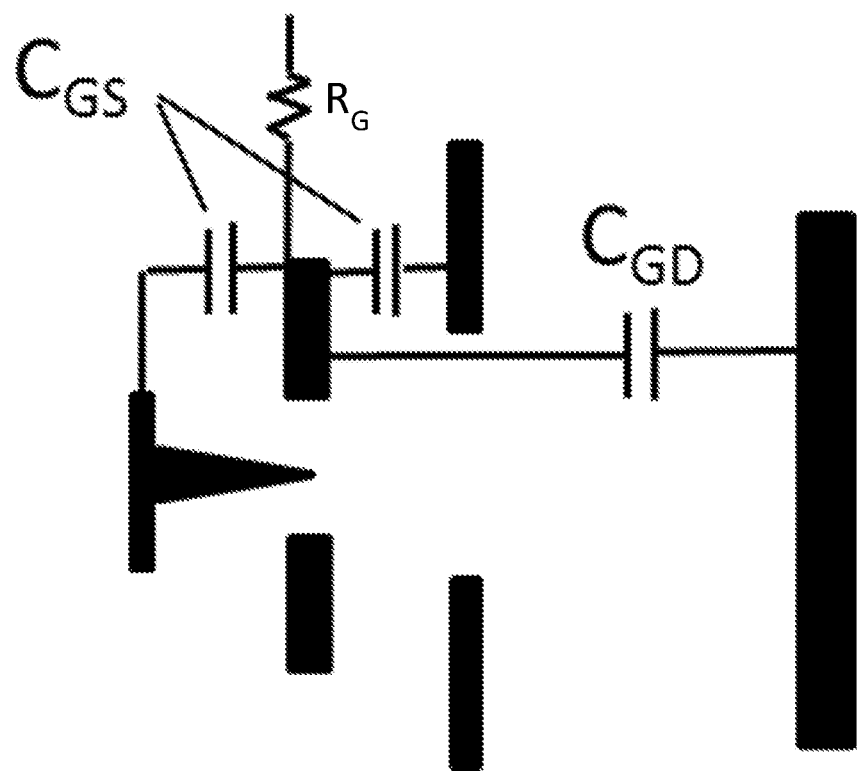
FIG. 3 shows a schematic drawing of the four electrodes, together with the capacitances CGS, and CGD, and resistance RG.

FIG. 3 shows a schematic drawing of the four electrodes, together with the capacitances $C_{GS}$, and $C_{GD}$, and resistance $R_G$. All calculated parameters are scaled to a width of 1 mm. All the parameters vary with the geometry. In this example, the gate resistance is estimated to be 0.5 ohms. This estimate is made knowing 1) that the gate may be fabricated from W, Mo, TiN, or other materials compatible with diamond growth and also having low resistivity, 2) that the gate metal thickness can be near 500 nm, and 3) that the gate can be contacted at intervals as little as 20 microns apart.

The capacitance between gate and source and screen electrodes $C_{GS}$ is calculated to be 329 fF/mm. The capacitance between gate and drain $C_{GD}$ is calculated to be 3.6 fF/mm.

Figure 4:
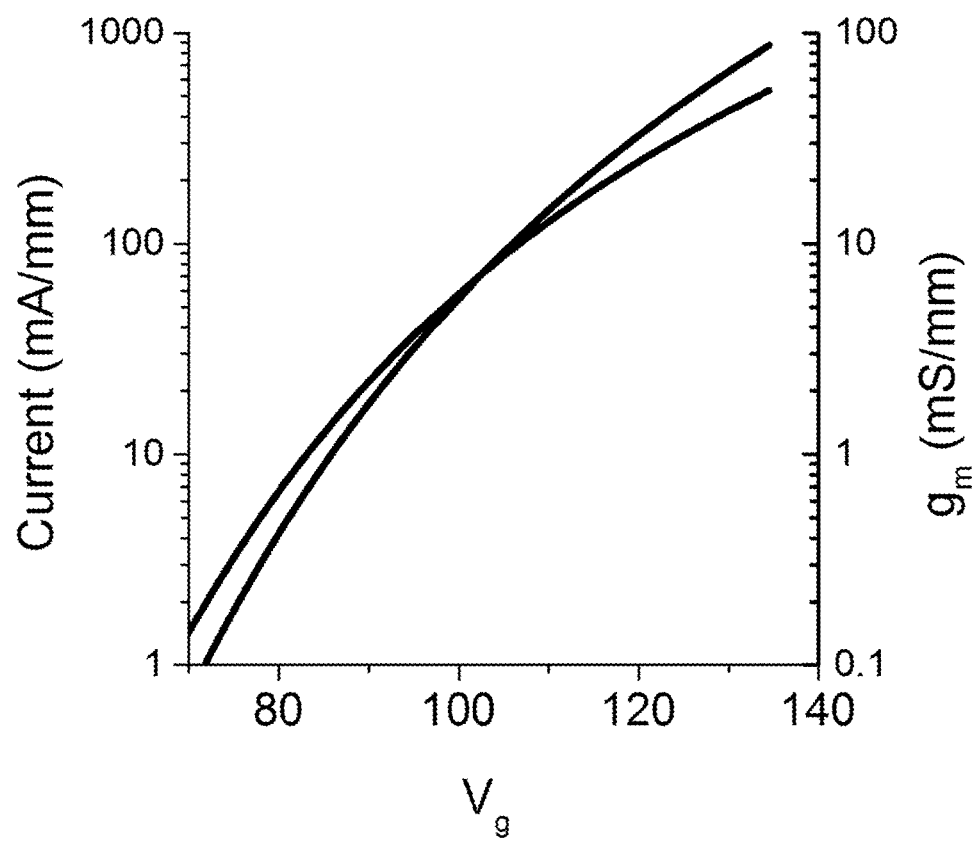
FIG. 4 shows calculated emission current and transconductance as a function of gate voltage.

The drain-source output resistance $R_{DS}$ is the inverse of the output conductance (change in current due to the drain voltage.) The output conductance is calculated to be approximately $10^{-4}$ times the transconductance $g_m$ (FIG. 4). The exact value of $R_{DS}$ varies with the design of the electrodes, especially the field plate electrode. If the field plate electrode were not present, the value of $R_{DS}$ would be substantially lower. Assuming $g_m$=20 mS, $R_{DS}$ would be 50 kΩ (larger for smaller $g_m$).

The time it takes for an electron to move from the emission site to the drain electrode (total transit time) limits the maximum frequency of the transistor. The time changes somewhat with the potentials placed on the electrodes. Assuming the gate potential is 125 V, the screen potential is 400 V, the drain potential is 500 V, and the source-drain distance is 30 μm, the total transit time is 2.8 ps. The time it takes for the electron to move just beyond the screen electrode, τ, is 1.7 ps. At that point the electron is certain to arrive at the drain, and so this time limits the frequency response. This time is also nearly independent of the drain voltage. Using this value the transit time limited frequency f=1/(2πτ)=94 GHz.

The calculated emission current and transconductance is plotted in FIG. 4 as a function of gate voltage. The transconductance is nearly proportional to emission current. The emission current increases rapidly with gate voltage.

The small signal voltage gain of the device is defined as $$\frac{1}{\sqrt{\frac{R_G}{R_{DS}} + g_m R_G \frac{C_{GD}}{C_{GS}}}}$$

The unity current gain frequency of the device is defined as $$f_t = \frac{g_m}{2\pi C_{GS}}$$

Figure 5:
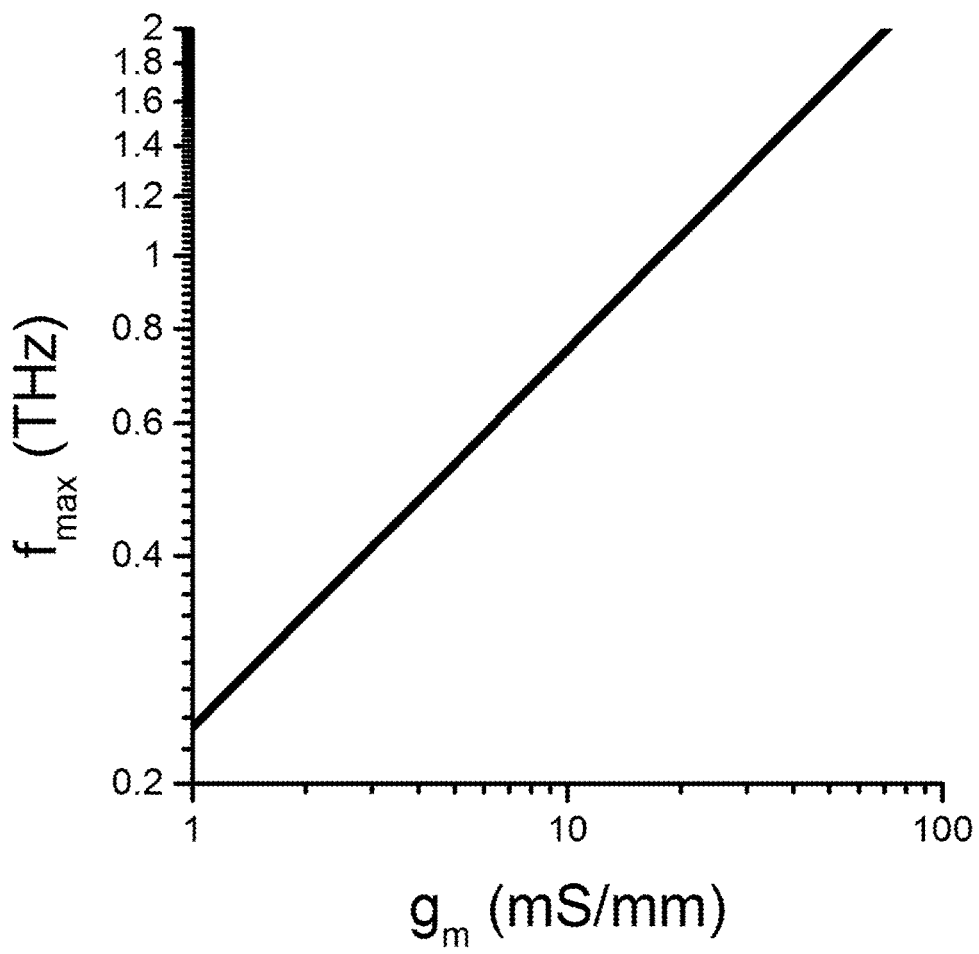
FIG. 5 shows Fmax plotted for a range of transconductance values.

The maximum oscillation frequency $f_{max}$ is the product of $f_t$ and the voltage gain. $F_{max}$ is plotted in FIG. 5 for a range of transconductance values. The plot shows that $f_{max}$ is close to 1 THz even for moderate transconductance values. These values of $f_{max}$ are substantially larger than state of the art transistor devices using solid state transport.

This device provides a horizontal structure, similar to other transistor geometries, but different than the vertical orientation typical of field emitters. The horizontal orientation allows all four electrodes to be fabricated on the same substrate surface.

Layers of polycrystalline diamond may be used to separate the source and gate electrodes. Diamond is used because it has several imporant properties:
1) can withstand electric fields in excess of $3\times10^8$ V/m
2) has moderate relative dielectric constant=5.5
3) is stable at high temperatures over 800° C.
4) is stable in vacuum or in the presence of reducing molecules such as hydrogen
5) may be deposited (grown) in the presence of materials which may be harmed by oxidation (e.g. graphene) without harming those materials.

Diamond films can be created over other materials by a process of dispersing small (nm) diamond seed crystals on the target surface followed by epitaxial growth on the seed crystals in a hydrogen plasma containing a small fraction of carbon. As the growth proceeds the seed crystals form a continuous layer free of voids. The minimum thickness required to form a void-free diamond layer is typically 300 nm, but can vary with conditions. To function optimally as a dielectric able to tolerate high maximum electric fields, the diamond is grown under specific conditions including substrate temperature, plasma power, and purity of the gases used to create the plasma.

Figure 6:
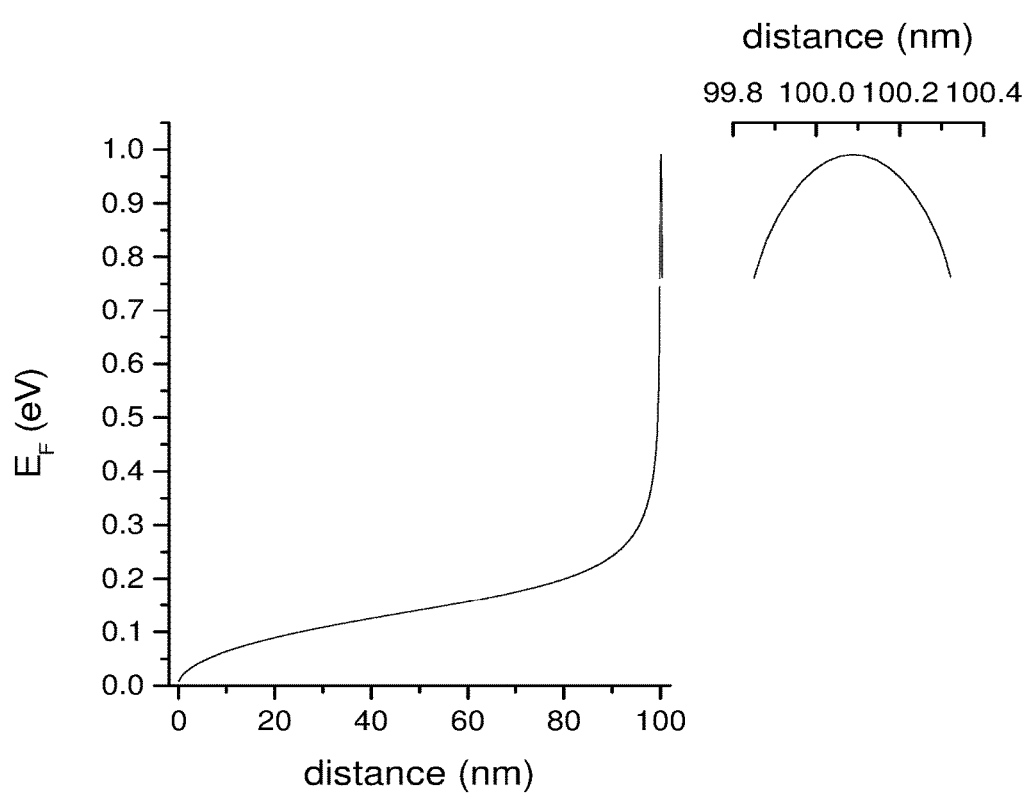
FIG. 6 shows the Fermi energy with respect to the neutrality level as a function of distance along the graphene surface.

The field emitter can be the edge of a graphene sheet, which has several benefits for a vacuum field emission transistor.
1) Graphene is mechanically strong, such that the large Coulomb stress will not break or excessively distort the shape when voltage is applied between the gate electrode and graphene source.
2) Graphene is chemically inert, such that typical water and hydrocarbon molecules, which can be adsorbed from the air at low temperatures, do not form strong chemical bonds easily and can be removed by heating to ≈300° C. in vacuum.
3) The electric conductivity of graphene is very high, allowing large currents to flow through the graphene without causing excessive power dissipation.
4) The electric conductivity is highest when both sides of the graphene sheet are suspended in vacuum and both surfaces are free of all adsorbed atoms, which is also the condition required for highest field emission current and transconductance.
5) The thermal conductivity of graphene is extremely high, such that any temperature rise in the graphene caused by field emission is minimized.
6) The thermal emittance of graphene is high, which combined with the two-dimensional nature of graphene causes the heat loss due to thermal radiation to be relatively large. This can help reduce any difference in emitter temperature relative to the surrounding surfaces.
7) Graphene has an unusual band structure that provides benefits in field emission. Graphene is a semi-metal, where the density of states falls to zero at the energy where the valence and conduction bands meet. This energy is called the charge neutrality point. If the graphene surface is clean and there are no impurities, the Fermi energy coincides with the charge neutrality point. If a positive electric potential is applied to an external electrode with respect to the graphene, electrons will accumulate in the graphene such that the Fermi energy will rise into the conduction band. This increased Fermi energy reduces the potential barrier to tunneling (also known as the work function) locally near the emission site. The density of states in graphene rises linearly with energy from zero at neutrality point. Since the density of states near the Fermi level is small in graphene, the Fermi energy rises further as a function of charge density in graphene than it would in most materials. Quantitatively, the Fermi energy in graphene is given by $E_F=hv_F\sqrt{\pi\rho}$, where $v_F$ is the Fermi velocity~$10^6$ m/s, h is $6.58\times10^{-16}$ eV-s, and $\rho$ is the charge density. FIG. 6 shows the Fermi energy with respect to the neutrality level as a function of distance along the graphene surface, assuming the geometry shown in FIG. 1, and taking the zero distance to be the inner edge of the graphene, such that the edge occurs at 100 nm. The Fermi energy rises very quickly near the graphene edge, with maximum near 1 eV. This calculation does not include additional states that may occur due to the dangling bonds at the emitter edge; such additional states are likely to reduce $E_F$ at the edge. Even if $E_F$ is less than calculated, it is still likely to be significant, and will increase the emission current and transconductance relative to a material with a larger density of states. The charge accumulated along the larger portion of the graphene sheet also helps increase the conductivity.
8) Because the electric field falls off with distance from a sharp apex with a characteristic length similar to the radius of curvature, and because the radius of curvature of graphene (0.14 nm) is much less than the tunneling distance (~1 nm), the field falls off significantly between the emitter surface and the point where the vacuum level becomes equal to the Fermi level. This situation is very different from field emission sources studied in the past, where the radius of curvature is significantly larger than the tunneling potential barrier width, and thus where the electric field is nearly constant over that distance. This has several consequences beneficial to a field emission source.
   a) The potential barrier for emission increases rapidly with angle on either side of the plane of the graphene sheet. This reduces the fraction of emission current produced at large angles relative to the sheet plane, i.e. the beam is relatively collimated and contains relatively little transverse energy. Collimation is important to the transistor design because the clear area required for the beam to pass can be reduced, allowing the gap in the screen electrode to be smaller and thus provide reduced source-drain resistance and reduced gate-drain capacitance. Low transverse energy is important to the transistor efficiency, since the total electron energy is equal to the sum of its longitudinal and transverse components, but only longitudinal component can be converted to RF power.

b) The tunneling probability is significantly higher for electrons above the Fermi level than would be the case for a larger radius emitter, and the tunneling probability is much lower for electrons below the Fermi level. The enhanced change in tunneling probability with energy favors cooling (due to emission of higher energy electrons) and discourages heating (due to emission of electrons from below the Fermi energy), such that the "crossover temperature" where the energy of field emission turns from heating to cooling is significantly reduced. It is estimated that the crossover temperature may be reduced by ~400 K (e.g. from 1200 K to 800 K) depending somewhat on the emission current. Whereas the crossover temperature can in many cases largely determine the emitter temperature, and whereas the durability of the emitter is reduced by excessive temperature, the reduced crossover temperature should increase the durability of the emitter.

c) For a given current density, the electric field immediately adjacent to the graphene edge is larger than would be the case for an emitter with larger radius. This increases the charge accumulation and Fermi energy, resulting in higher emission current as discussed in point 7.

The device includes a substrate having a dielectric surface. The substrate may be entirely dielectric, or it may have a dielectric layer that is thick enough to avoid voltage breakdown during operation of the device. The substrate surface may also have a high thermal conductivity, which may improve the performance of the device. Suitable dielectric surfaces include, but are not limited to, diamond, aluminum nitride, and silicon carbide.

The device includes a gate electrode, a drain electrode, a source electrode, and optionally a field plate electrode on the substrate not in electrical contact with each other. As used herein "in electrical contact" means that a current may flow not materially impeded or regulated from one part to the other either by direct physical contact through other conductive materials in direct physical contact. As used herein "on the substrate" can mean directly placed in contact with the substrate or placed indirectly on the substrate with intervening layers. For example, FIG. 1 shows the gate, drain, and field plate in direct contact with the substrate, with the source indirectly contacting the substrate with the gate in between, as well as an optional dielectric layer. The source is adjacent to the gate, meaning that the source edge is close to the gate but may be laterally displaced from gate. FIG. 2 shows the gate indirectly contacting the substrate with the field plate in between. Further, the gate and field plate may each have two portions. The gate portions may be vertically displaced above and below the emitter edge, and the field plate portions may be vertically displaced directly above and below either the gate or a line of sight or other viable electron path from the edge to the drain. Alternatively, either the upper or lower portions of either of these electrodes may be used alone. All these configurations are encompassed by "on the substrate". As used herein "vertically displaced" means closer to or further from the substrate than a reference point, but not necessarily directly above or below the reference point. As used herein "laterally" means in a direction parallel to the substrate, with or without vertical displacement.

The electrodes may comprise any conductive material, such as metals. Materials with higher electrical conductivity may improve the performance of the device. Materials with low high vapor pressure at high temperature and high melting point may enable growth of the two-dimensional material and/or dielectric materials such as diamond. The source electrode also includes a conductive two-dimensional material. Such materials are generally planar molecules that are one atom thick, though the atoms may not all be in the same perfect geometric plane. Suitable two-dimensional materials include, but are not limited to, graphene, graphyne, molybdenum disulfide, molybdenum diselenide, and molybdenum ditelluride. These compounds all have a hexagonal crystal structure.

The source electrode has two parts in electrical contact with each other: the two-dimensional material and a conductive contact. The source electrode contact may be a typical metal, or it may be more of the two-dimensional material. An edge of the source electrode is formed from the two-dimensional material. The edge may be generally parallel to the substrate. It may be a straight line, or it may be curved in any direction as long as the gate has a matching curve. The 2-D molecules on the edge are "aimed at" the drain. That is, if the planes of the molecules were extended, they would intersect the drain. The edge is suspended in free space, vertically displaced from the gate and the substrate. That is, it is not touching the gate, substrate, or any other physical part of the device. The minimum distance between the 2D edge and the nearest supporting material should be approximately 10 nm, and performance may be improved if the distance is larger. Performance may be improved if the edge is vertically displaced far enough from the substrate to minimize the number of tunneling electrons that strike the substrate. The edge can be considered to be only the portion of the source that meets these requirements or less, even if the source include additional 2D material that does touch other components. The edge may be only a single molecule thick in a small portion closest to the drain, whereas the 2D material may have multiple layers elsewhere. The width of the source edge may be consistent with the desired frequency response of the device, for example approximately 100 microns for operation at frequencies near 100 GHz.

The gate may have a variety of shapes and placements. Laterally, it may be entirely or in part between the edge and the drain. For example, as shown in FIGS. 1 and 2, the right-most part of the gate is closer to the drain than the edge. The gate may also be entirely behind the edge (that is the edge may be laterally between the gate and the drain). For example, the distance from the drain to the edge may be at least ten times the distance from the gate to the edge, with the distances measured from the points of the components that are closest together. The gate may have a straight edge that is equidistant from the emitter edge along their length, it may be curved to match a curved emitter edge. If the gate has portions above and below the edge, they may both be the same distance from the edge, or the portion above the edge may have different position and shape from the lower portion. The vertical distance between the gate and edge may be minimized to reduce the voltage required to cause field emission. One example suitable distance is about 0.5 microns. The gate may be shaped and placed in a way that minimizes the vertical component of the electric field.

The field plate, if present, improves and reduces the output conductance of the device. It has at least a portion that is laterally between the gate and the drain. The entire field plate may be so placed as in FIG. 1, or the remainder of it may be directly above and/or below the gate as in FIG. 2.

The gate and field plate may have only one layer each, either above or below the edge, which may be easier to fabricate. Alternatively, they may have layers both above and below the edge. This may provide better performance, but is more complicated to fabricate. It requires forming two layers, and possibly connecting posts between the layers. Regardless of the configuration of the gate and field plate, they allow for a direct line of sight from the edge to the drain without blocking the line of sight. The electron beam may pass through the gate such that the vertical component of electric field created by the source-gate voltage is minimized while the lateral component of that electric field is maximized. The electron beam may pass through the field plate such that the electric field created at the source edge by the drain voltage is minimized.

Figure 7:
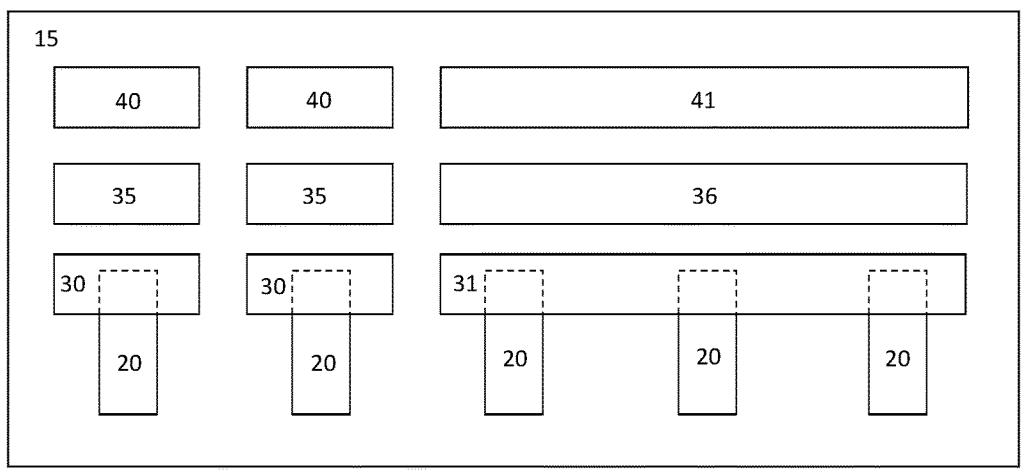
FIG. 7 show a top view of more than one of the devices.

The drain is laterally displaced from the edge, such that the distance between the edge and drain is much larger than the distance between the edge and gate. The drain may or may not have a surface that is perpendicular to the line of sight, as long as the line of sight intersects the drain or is parallel to the drain surface. As shown in FIG. 7 (top view), a substrate 15 may have more than one set of the electrodes, including the use of two or more of the drain electrodes 41, gate electrodes 31, or field plate electrodes 35 forming a single monolithic electrode. The distance from the source edge to the drain electrode may be consistent with the desired frequency response of the device, for example approximately 30 microns for operation at frequencies near 100 GHz.

Optionally, a dielectric material layer is present between the source and the gate as a method to prevent electrical contact between them. Minimizing the capacitance between the source and gate may reduce the require input power of the device. If the gate is both above and below the source, then the dielectric layer would also be so. One suitable dielectric layer is diamond (rather than diamond-like carbon), which may be grown by chemical vapor deposition with hydrogen plasma.

Optionally, a buffer layer is present above and below the source electrode. The buffer layer acts a sacrificial layer that can be etched away to provide the space above and below the edge. The buffer can be any etchable or vapor-phase etchable, including but not limited to Si, Ge, SiGe, Mo, Ti, TiN, Ta, TaN, W, TiW, SiO, and $SiO_2$. $XeF_2$ and HF are suitable etchants depending on the buffer layer.

The device may be enclosed in a vacuum enclosure. Methods for vacuum sealing are known. The vacuum may be preserved after sealing by enclosing the device with a getter, such as titanium or barium. The degree of vacuum required is determined by both the mean free path of electrons in the gas and the chemical reaction or physical adsorption that may occur. For example, a nonreactive gas such as hydrogen may have a partial pressure up to 1 Torr, and reactive gases such as oxygen, carbon dioxide, and water may have partial pressures up to $10^{-8}$ Torr. The device may include conductive leads to the electrodes, these may connect to circuitry capable of applying voltages to the electrodes to operate the device as a field effect transistor, causing electrons to tunnel from the source to the drain.

The device is made by depositing the gate, source, field plate, dielectric, and buffers layers as needed in the appropriate sequence onto the substrate to form a stack. Part of the stack is then etched away to form the components in the configurations described herein. The source electrode may be formed by depositing a full layer of the 2D material, with the molecules in the proper orientation at the edge. For example, graphene may be separately grown and then transferred to the device using methods described in US Pat. Appl. Publ. No. 2012/0244358; Lock et al., *Nano Lett.*, 12(1) 102-107 (2012); and Lock et al., *Surf Coat. Tech.*, 241, 118-122 (2104). Alternatively, graphene may be grown directly on the surface of a metal source electrode.

One example method uses the following steps:
a) providing a substrate having an optically flat and smooth dielectric surface;
b) patterning a conducting layer to form the source contact, gate, field plate (optional), and drain;
c) depositing one or more layers of sacrificial materials (that can be removed in a vapor-phase etch);
d) depositing a two-dimensional material over the sacrificial layers;
e) depositing a thin protective layer (such as SiO or $SiO_2$) over the two-dimensional material;
f) depositing a metal onto selected areas of the two-dimensional material by first patterning photoresist, followed by removal of the protective layer, followed by metal deposition. The pattern is to include a large area for electric contact terminating in a comb-like pattern for mechanical support where lines 100-1000 nm long and wide separated by gaps 1-10 microns wide extend to the desired edge of the two dimensional material;
g) removing unwanted portions of the two-dimensional material, for example by patterning photoresist followed by etching the two-dimensional material (e.g. graphene etched in oxygen plasma) and finally removing the remaining photoresist;
h) removing the exposed sacrificial material (not covered by metal or the two-dimensional material) by exposure to a vapor-phase etch, including undercut of the two-dimensional material at least 100 nm from the edge.

The sacrificial material may be Si, Ge, SiGe, Mo, (Ti, TiN, Ta, TaN, W, TiW) which may be selectively etched with $XeF_2$ gas, or SiO or $SiO_2$ which can be etched with HF gas. Step h) may be performed with a gas-phase etch to prevent the two-dimensional material from collapse and sticking to the substrate, or alternatively a wet etch may be used in conjunction with a critical point dryer.

The two-dimensional material of step d) may be transferred from a separate substrate onto the sacrificial layer. Alternatively, the two-dimensional material of step d) is grown on top of the sacrificial layer by one of several methods as have been demonstrated. For example covering the sacrificial material with a complete layer of a catalytic metal such as Cu or Ni, then heating the layer in the presence of a precursor gas thereby causing formation of a 2D material at the interface between the sacrificial material and the catalytic metal, and finally removing the catalytic metal layer, typically by wet etching. Another method involves seeding the layer with a small amount of a catalytic metal (for example a Pt group metal (Pt, Ir, Os, Ru, Pd, or Ni) followed by exposure to precursor atoms, typically at elevated temperature up to 1200° C.).

The method may also be described as: providing a substrate having a dielectric surface; depositing a conductive material in a pattern to form the gate and drain, depositing one or more layers of materials which can be selectively etched using a vapor phase etch, growing or transferring a 2D material onto the selectively etchable material, coating the 2D material with additional layers of selectively etchable material, patterning photoresist over this surface followed by etching the of selectively etchable material and deposition of a conductive and mechanically rigid material where the pattern is created to provide an array of mechanical beams running perpendicular to the edge, pattering a layer of conductive material over the mechanical beams, patterning photoresist to protect the edge followed by etching the top selectively etchable materials followed by etching the 2D material followed by etching the remaining selectively etchable materials. The last step may be postponed while fabricating an air-bridge structure as described below.

To fabricate a gate having both a lower and upper portion where the electron beam passes between the upper and lower portion, an air-bridge structure may be used. A layer of selectively etchable material is deposited over the existing surface and patterned with a set of holes over the existing gate electrode, then a layer of photoresist is patterned over the selectively etchable material. A layer of conductive material is deposited over the patterned resist, such that portions of the conductive material are in contact with the selectively etchable material. The conductive material may be thickened by electroplating or other method. The thickness is determined adequate to resist excessive bending under the Coulomb force created when a voltage is applied between the gate and the source. After thickening the resist is removed and the selectively etchable material is removed, such that the upper portion of the gate is suspended. The same method may be used to create an upper portion of a field plate. The source emitter edge can be located either between or adjacent to the gate electrodes. The conductive contact is located adjacent to the gate electrode. The gate electrode is laterally between the emitter edge and the drain electrode. The edge does not contact any other component of the device. The gate electrode, the drain electrode, and the source electrode are not in electrical contact with each other. The device is configured to provide a line of sight from the edge to the drain electrode.

Obviously, many modifications and variations are possible in light of the above teachings. It is therefore to be understood that the claimed subject matter may be practiced otherwise than as specifically described. Any reference to claim elements in the singular, e.g., using the articles "a", "an", "the", or "said" is not construed as limiting the element to the singular.

What is claimed is:

1. A device comprising:
   a substrate having a dielectric surface;
   a gate electrode on the substrate;
   a drain electrode on the substrate; and
   a source electrode adjacent to the gate electrode comprising:
      a conductive contact; and
      an edge comprising a conductive two-dimensional material in electrical contact with the conductive contact;
   wherein the drain electrode is not laterally between the edge and the gate electrode;
   wherein the distance from the drain electrode to the edge is greater than the distance from the gate electrode to the edge; wherein the edge is vertically displaced from the substrate and the gate electrode; and
   wherein the gate electrode, the drain electrode, and the source electrode are not in electrical contact with each other; and
   wherein the device is configured to provide a line of sight or electron path from the edge, through a gas or vacuum, and to the drain electrode.

2. The device of claim 1, wherein the edge comprises graphene.

3. The device of claim 1, wherein the edge is parallel to the substrate.

4. The device of claim 1, wherein the gate electrode comprises:
   a first gate electrode portion vertically displaced above the edge; and
   a second gate electrode portion vertically displaced below the edge.

5. The device of claim 1, further comprising:
   a field plate electrode on the substrate;
      wherein the field plate electrode is not in electrical contact with the gate electrode, the drain electrode, and the source electrode; and
      wherein the field plate electrode comprises a portion that is laterally between the gate electrode and the drain electrode.

6. The device of claim 5, wherein the field plate electrode comprises:
   a first field plate electrode portion vertically displaced directly above the gate electrode; and
   a second field plate electrode portion vertically displaced directly below the gate electrode.

7. The device of claim 5, wherein the field plate electrode is entirely laterally between the edge and the drain electrode.

8. The device of claim 5, wherein the field plate electrode comprises:
   a first field plate electrode portion vertically displaced directly above the line of sight; and
   a second field plate electrode portion vertically displaced directly below the line of sight.

9. The device of claim 1, further comprising:
   a dielectric material between the source electrode and the gate electrode.

10. The device of claim, 9 wherein the dielectric material comprises diamond.

11. The device of claim 9, further comprising:
    a buffer layer between the dielectric material and the source electrode.

12. The device of claim 1, wherein the dielectric surface comprises diamond, aluminum nitride, or silicon carbide.

13. The device of claim 1, wherein the device comprises more than one set of the gate electrode, the source electrode, and the drain electrode.

14. The device of claim 13, wherein two or more of the drain electrodes form a single monolithic drain electrode.

15. The device of claim 1, further comprising:
    an enclosure sealing the source electrode, the gate electrode, and the drain electrode in a vacuum.

16. The device of claim 15, further comprising:
    conductive leads electrically connecting the source electrode, the gate electrode, and the drain electrode to circuitry capable of operating the device as a field effect transistor.

17. A method comprising:
    providing the device of claim 16; and
    applying voltages to the source electrode, the gate electrode, and the drain electrode to cause electrons to tunnel from the source electrode into the vacuum followed by transport in the vacuum to the drain electrode.

18. A method of fabricating a device comprising:
    providing a substrate having a dielectric surface;
    depositing a gate electrode material, a dielectric material, and a source electrode material onto the substrate to form a stack;
    etching away a portion of the stack to form a gate electrode and a source electrode;

wherein the source electrode comprises:
a conductive contact; and
an edge comprising a conductive two-dimensional material in electrical contact with the conductive contact;
wherein the edge is vertically displaced from the substrate and the gate electrode; and
depositing a drain electrode material onto the substrate to form a drain electrode;
wherein the drain electrode is not laterally between the edge and the gate electrode;
wherein the distance from the drain electrode to the edge is greater than the distance from the gate electrode to the edge; wherein the gate electrode, the drain electrode, and the source electrode are not in electrical contact with each other; and
wherein the device is configured to provide a line of sight or electron path from the edge, through a gas or vacuum, and to the drain electrode.

19. The method of claim 18, wherein depositing the source electrode material comprises:
depositing the two-dimensional material.

20. The method of claim 18, wherein depositing the source electrode material comprises:
depositing a metal layer; and
growing a two-dimensional material on the metal layer to form the edge.

21. The method of claim 18, wherein the gate electrode comprises:
a first gate electrode portion vertically displaced above the edge; and
a second gate electrode portion vertically displaced below the edge.

22. The method of claim 18, further comprising:
depositing a field plate electrode material on the substrate or the gate electrode to form a field plate electrode;
wherein the field plate electrode is not in electrical contact with the gate electrode, the drain electrode, and the source electrode; and
wherein the field plate electrode comprises a portion that is laterally between the gate electrode and the drain electrode.

23. The method of claim 22, wherein the field plate electrode comprises:
a first field plate electrode portion vertically displaced directly above the gate electrode; and
a second field plate electrode portion vertically displaced directly below the gate electrode.

24. The method of claim 22, wherein the field plate electrode is entirely laterally between the edge and the drain electrode.

25. The method of claim 22, wherein the field plate electrode comprises:
a first field plate electrode portion vertically displaced directly above the line of sight; and
a second field plate electrode portion vertically displaced directly below the line of sight.

26. The method of claim 18, further comprising:
depositing a dielectric material between the source electrode and the gate electrode as part of the stack.

27. The method of claim 26, wherein the dielectric material comprises diamond.

28. The method of claim 26, further comprising:
depositing a buffer layer between the dielectric material and the source electrode as part of the stack.

29. The method of claim 18, wherein the device comprises more than one set of the gate electrode, the source electrode, and the drain electrode.

30. The method of claim 29, wherein two or more of the drain electrodes, gate electrodes, or field plate electrodes form a single monolithic electrode.

31. The method of claim 18, further comprising:
depositing conductive leads electrically connected to the source electrode, the gate electrode, and the drain electrode.

32. The method of claim 31, further comprising:
enclosing the source electrode, the gate electrode, and the drain electrode in a vacuum enclosure.

33. A method of fabricating a device comprising:
providing a substrate having an optically flat and smooth dielectric surface;
patterning a conducting layer to form a source electrode contact, a gate electrode, optionally a field plate electrode, and a drain electrode;
depositing one or more layers of sacrificial materials;
depositing a conductive two-dimensional material over the sacrificial layers;
depositing a protective layer over the two-dimensional material;
depositing a metal onto selected areas of the two-dimensional material by:
patterning a photoresist;
removing the protective layer;
depositing the metal;
removing unwanted portions of the two-dimensional material;
removing any remaining photoresist;
removing the exposed sacrificial material not covered by the metal or the two-dimensional material by exposure to a vapor-phase etch;
wherein removing the exposed sacrificial layer undercuts the two-dimensional material at least 100 nm from the edge; and
depositing a drain electrode material onto the substrate to form a drain electrode;
wherein the edge is laterally between the gate electrode and the drain electrode;
wherein the gate electrode, the drain electrode, and the source electrode are not in electrical contact with each other; and
wherein the device is configured to provide a line of sight from the edge to the drain electrode.

34. The method of claim 33, wherein the two-dimensional material is transferred from a separate substrate onto the sacrificial layer.

35. The method of claim 33, wherein the two-dimensional material is grown on top of the sacrificial layer by seeding the sacrificial layer with a Pt group metal followed by exposure to gas phase carbon and hydrogen atoms at a temperature between 500° C. and 1000° C.

36. The method of claim 33, wherein the two-dimensional material is replaced or augmented by growing additional two-dimensional material after removing the exposed sacrificial material.

* * * * *